United States Patent [19]
Chevallier

[11] Patent Number: 5,898,634
[45] Date of Patent: Apr. 27, 1999

[54] INTEGRATED CIRCUIT WITH SUPPLY VOLTAGE DETECTOR

[75] Inventor: Christophe J. Chevallier, Palo Alto, Calif.

[73] Assignee: Micron Technology, Inc., Santa Clara, Calif., CA

[21] Appl. No.: 08/877,123

[22] Filed: Jun. 17, 1997

[51] Int. Cl.[6] ............................................ G11C 5/14
[52] U.S. Cl. ................................. 365/226; 365/201
[58] Field of Search .............................. 365/226, 185.02, 365/201, 189.09

[56] References Cited

U.S. PATENT DOCUMENTS

| | | | |
|---|---|---|---|
| 5,268,871 | 12/1993 | Dhong et al. | 365/226 |
| 5,301,161 | 4/1994 | Landgraf et al. | 365/226 |
| 5,352,945 | 10/1994 | Casper et al. | 307/603 |
| 5,363,335 | 11/1994 | Jungroth et al. | 365/226 |
| 5,373,227 | 12/1994 | Keeth | 323/313 |
| 5,418,747 | 5/1995 | Tobita | 365/226 |
| 5,581,206 | 12/1996 | Chevallier et al. | 327/143 |
| 5,594,360 | 1/1997 | Wojciechowski | 365/226 |
| 5,596,534 | 1/1997 | Manning | 365/226 |
| 5,615,151 | 3/1997 | Furuno et al. | 365/226 |

OTHER PUBLICATIONS

"Compact Flash 4—15 MB", *1997 Flash Memory Data Book*, Micron Quantum Devices Inc. Boise, Idaho, 3–1 to 3–3, (1997).

"Flash Memory 2MEG x8", *1997 Flash Memory Data Book*, Micron Quantum Devices Inc. Boise, Idaho, 2–5 to 2–33, (1997).

*Primary Examiner*—Tan T. Nguyen
*Attorney, Agent, or Firm*—Schwegman, Lundberg, Woessner & Kluth, P.A.

[57] ABSTRACT

An integrated circuit is described which includes a supply voltage detection circuit. The detection circuit produces an output which indicates a voltage range of the supply voltage. The output of the detection circuit is used to adjust the operation of the integrated circuit. The integrated circuit is described as a flash memory device which can include a controller to monitor the output of the detection circuit, or provide the output to an external controller. The controller uses the detection circuit output to adjust memory operation, such as a programming pulse length.

34 Claims, 5 Drawing Sheets

5,898,634

INTEGRATED CIRCUIT WITH SUPPLY VOLTAGE DETECTOR

TECHNICAL FIELD OF THE INVENTION

The present invention relates generally to integrated circuits and in particular the present invention relates to voltage detector circuitry in integrated circuits.

BACKGROUND OF THE INVENTION

Most electronic devices are sensitive to changes in voltage supply levels. Devices incorporating integrated circuits such as portable computer and digital cameras are typically sensitive to the supply voltage and will show variations in output due to variations in the supply voltage. The devices, therefore, are usually designed to avoid or decrease sensitivity to changes in the supply voltage. To achieve this result, the device circuitry becomes more complex.

Supply voltage sensors can be provided in these devices. The sensors, however, are typically an analog integrated circuit which cannot easily be implemented in an application specific integrated circuit ASIC or logic design. Thus, an extra integrated circuit is required to provide a voltage supply sensor in an electronic device.

For the reasons stated above, and for other reasons stated below which will become apparent to those skilled in the art upon reading and understanding the present specification, there is a need in the art for an integrated circuit which includes a supply voltage sensor which does not greatly effect the size or complexity of the integrated circuit.

SUMMARY OF THE INVENTION

The above mentioned problems with voltage detection and other problems are addressed by the present invention and which will be understood by reading and studying the following specification. An integrated circuit is described which samples a supply voltage.

In particular, the present invention describes an integrated memory device comprising a voltage detection circuit for tracking a voltage of the integrated memory device and producing an output signal indicating a voltage range, and a control circuit coupled to the voltage detection circuit for receiving the output signal on an output node and adjusting an operation parameter of the integrated circuit memory device in response to the output signal.

An integrated memory device is also described which comprises a voltage detection circuit for tracking a voltage of the integrated memory device and producing a multiple-bit digital output signal indicating a voltage range. The device also includes a status register latch circuit for storing the multiple-bit output signal, and a control circuit coupled to the voltage detection circuit and the status register latch circuit, the control circuit adapted to activate the voltage detection circuit and receive the multiple-bit output signal, and adapted to retrieve the multiple-bit output signal from the status register latch circuit.

In yet another embodiment, a method of operating an integrated circuit is described. The method comprises the steps of receiving a supply voltage, detecting a voltage range of the supply voltage using an internal voltage detector, generating a multiple bit signal representing the detected voltage range, and adjusting the operation of the integrated circuit in response to the detected voltage range.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

A supply voltage detector is described which can be provided on an integrated circuit to monitor the supply voltage and provide an output. The output can be used by the integrated circuit for any number of purposes. Alternatively, the output can be provided to external components, such as a microprocessor, for use thereby. One type of integrated circuit which is well suited to benefit from the internal voltage supply detector is an integrated memory device. The memory device can be any configuration, including but not limited to DRAM, SRAM, EEPROM, and Flash EPROM. Prior to describing the voltage detection circuit, a brief description is provided of a Flash memory which can incorporate a voltage detector.

Flash Memory

Figure 1A:
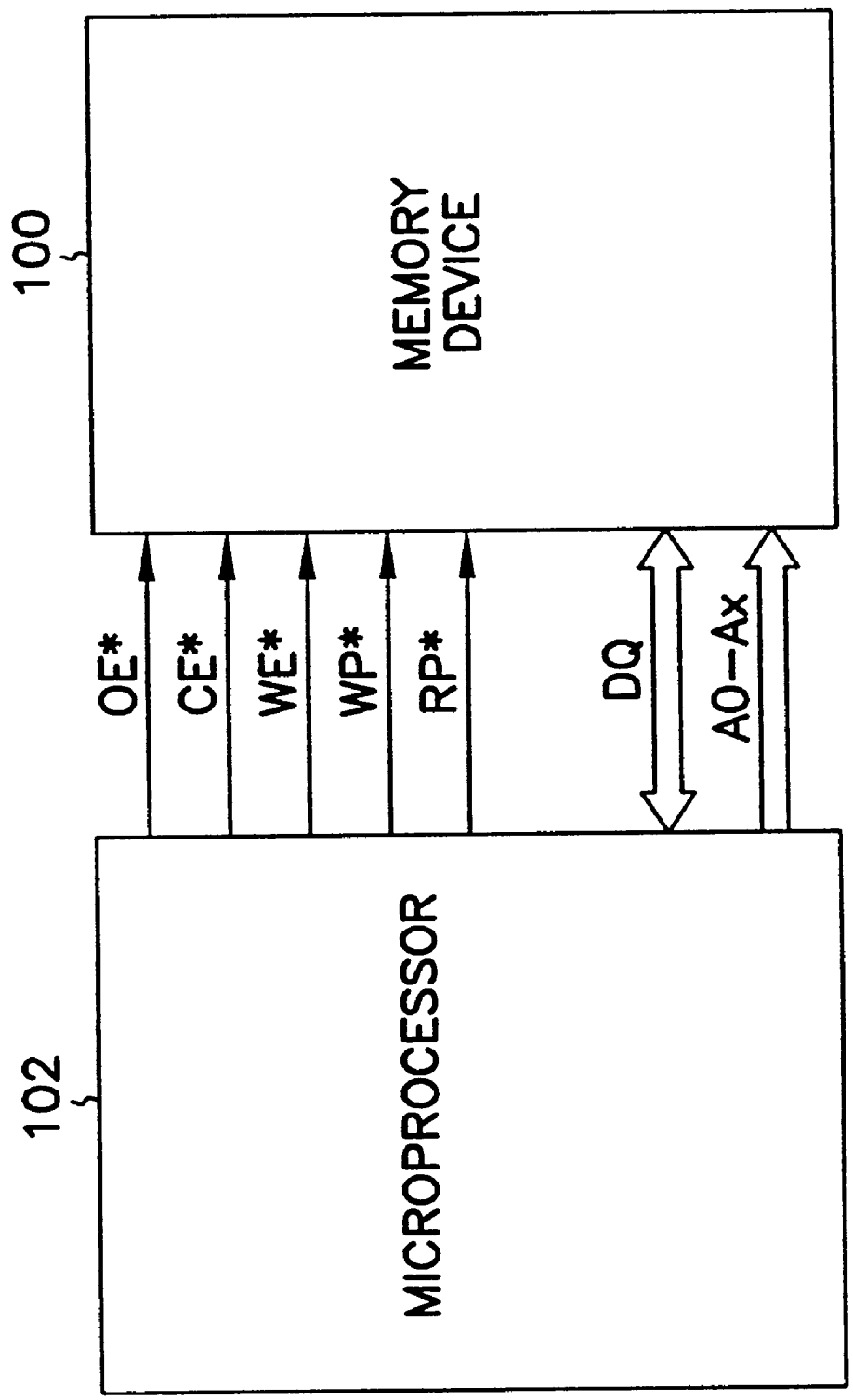
FIG. 1A is a block diagram of a flash memory system.
Figure 1B:
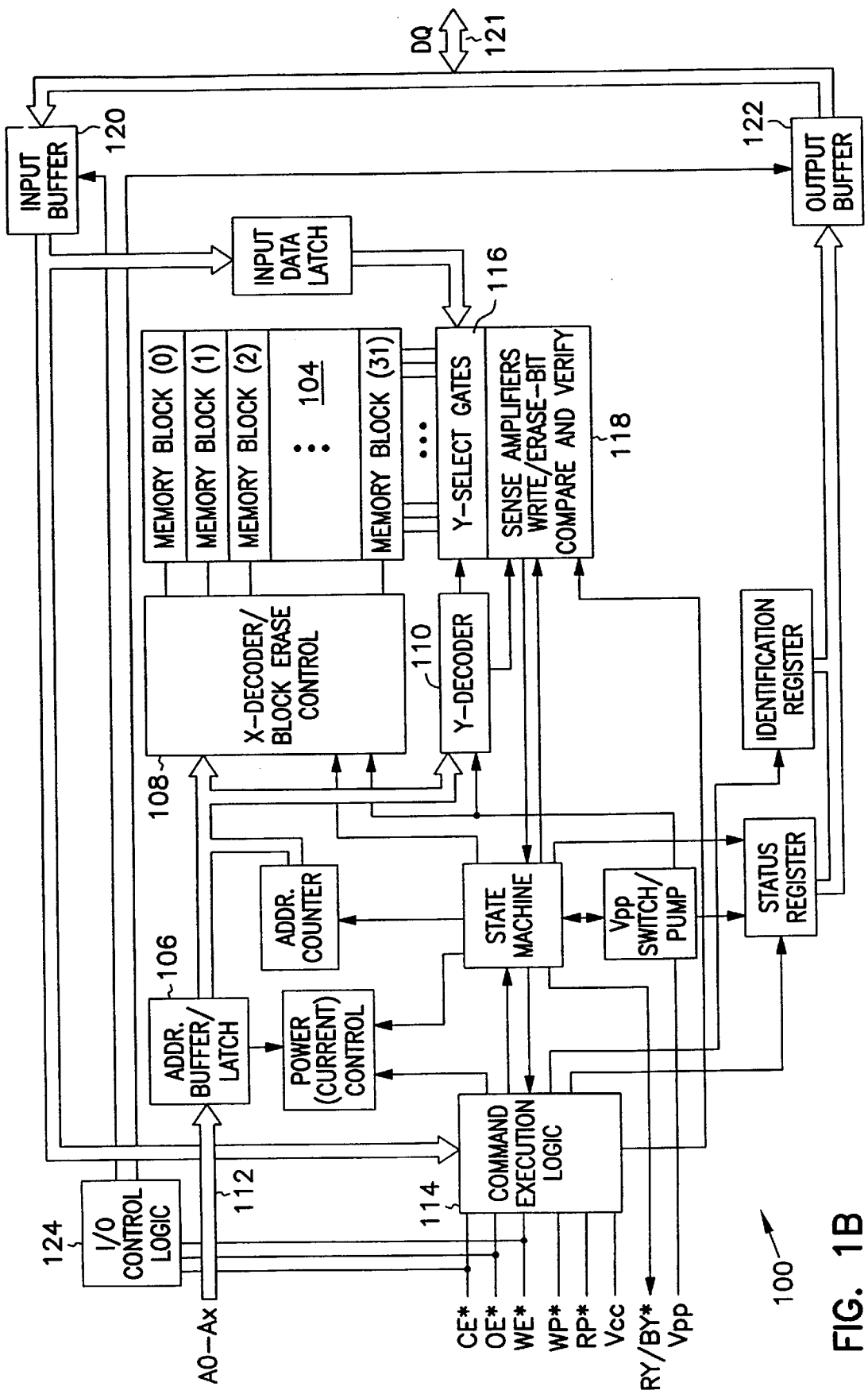
FIG. 1B is a detailed illustration of the flash memory of FIG. 1A.

FIG. 1A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104, FIG. 1B. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

An x-decoder 108 and a y-decoder 110 are provided to decode address signals provided on address lines A0-Ax 112. An address buffer circuit 106 is provided to latch the address signals. Address signals are received and decoded to access the memory array 104. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes an internal circuity in command control circuit 114 for generating timing signals. As stated above, the Flash memory of FIG. 1A has been simplified to facilitate a basic understanding of the features of the memory. A more detailed understanding of Flash memories is known to those skilled in the art. See "1997 Flash Memory Data Book" pages 2-5 to 2-33 available from Micron Quantum Devices, Inc. (incorporated herein by reference) for a more detailed description of a Flash memory.

Figure 1C:
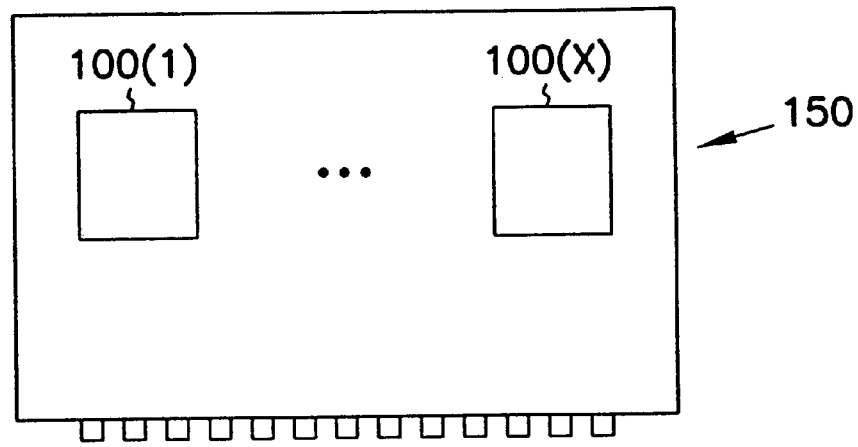
FIG. 1C is a diagram of a memory card including several flash memories of FIG. 1B.

It will be appreciated that more than one Flash memory can be included in various package configurations. For example, compact Flash memory cards 150 can be manufactured in varying densities using numerous Flash memories 100(1)–100(x) as illustrated in FIG. 1C. See "1997 Flash Memory Data Book" pages 3-1 to 3-3 available from Micron Quantum Devices, Inc. (incorporated herein by reference) for a more detailed description of a Flash memory card.

Voltage Detector Circuit

Figure 2:
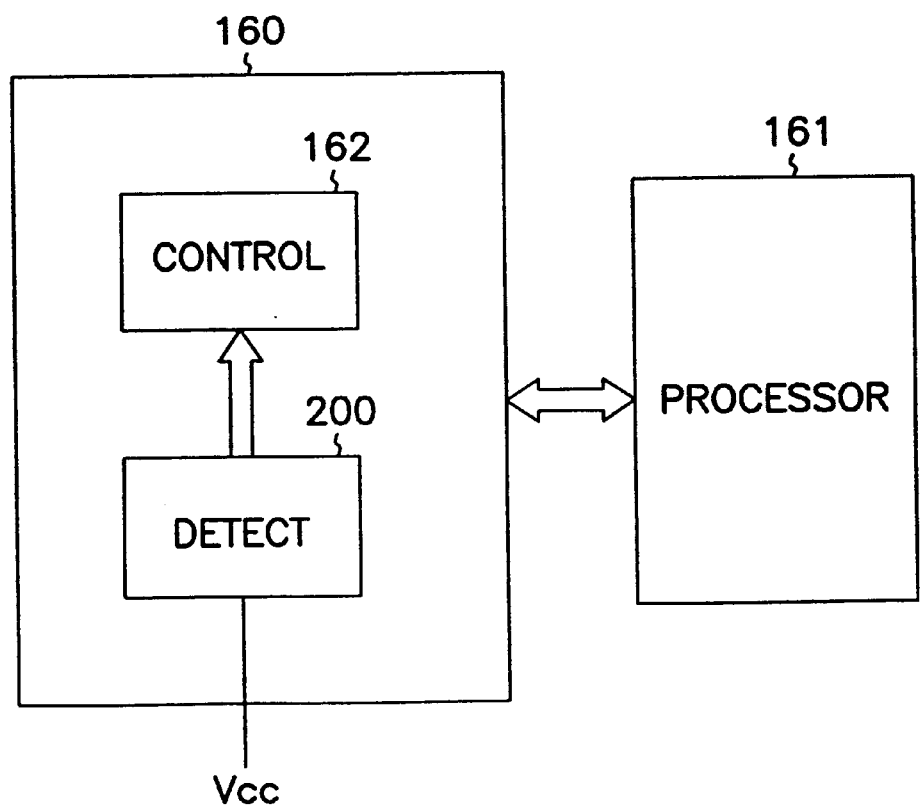
FIG. 2 is a block diagram of an integrated circuit incorporating a voltage detection circuit.

FIG. 2 is a block diagram of an integrated circuit 160 which includes a control circuit 162 for controlling the operation of the integrated circuit and a voltage supply detection circuit 200. The integrated circuit can be coupled to an external controller or processor 161, referred to herein generally as a processor. In a preferred embodiment, the integrated circuit is a memory device, such as a flash memory. The control circuit 162 can receive output data from the voltage detector and determine the present range of the supply voltage, Vcc. The control circuit can then adjust operating parameters of the integrated circuit in response to the detected supply voltage level. The detection circuit 200 can be operational at all times when the integrated circuit is operational, or the detection circuit can be selectively operated only in response to a sample request. If the detection circuit is sampled, the output can be stored in a latch for continued use by the integrated circuit when the detection circuit is inactive, see FIG. 3 described in detail below. The output signal from the detector can be either analog or digital, and additionally can be a multiple-bit signal.

Figure 3:
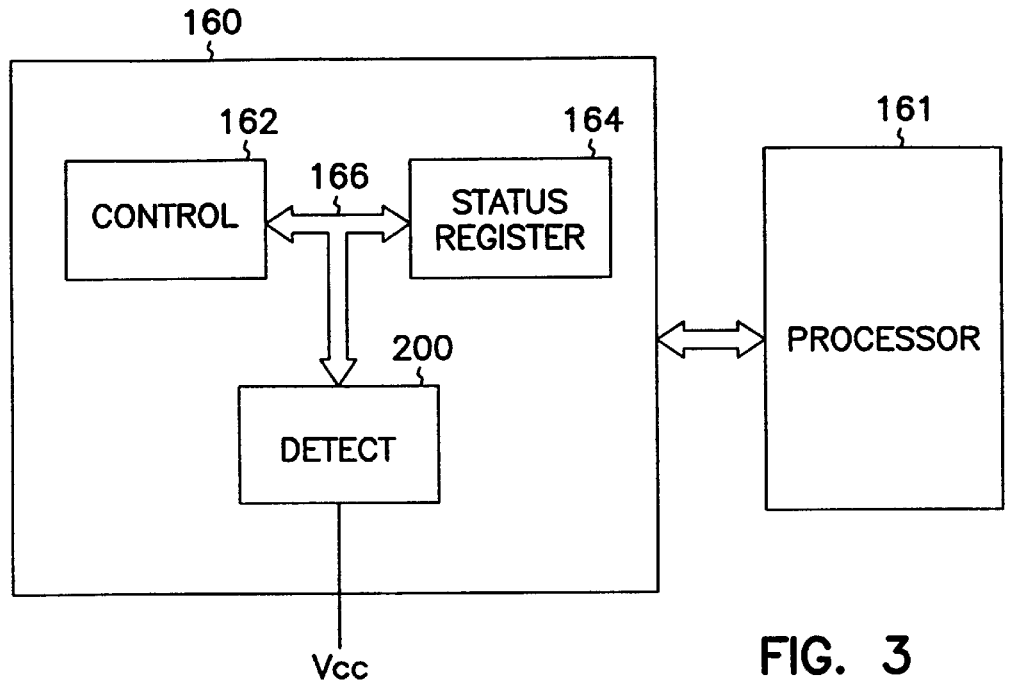
FIG. 3 is a block diagram of an alternate integrated circuit incorporating a voltage detection circuit.

Referring to FIG. 3, a block diagram is provided of an integrated circuit 160 including control circuitry 162 for controlling the operation of the integrated circuit, an optional status register 164, and a supply voltage detector circuit 200. The integrated circuit is coupled to an external processor 161. Again, the integrated circuit can be a memory device, such as a flash memory. In operation, the voltage detector circuit samples the supply voltage Vcc and outputs a signal on bus 166. The output can then be used directly by the control or latched in status register 164. The status register can be either a volatile or non-volatile latch circuit. The control circuit 162 can then use the data stored in the status register to determine the current voltage range of Vcc. For example, Vcc can be sampled before each program operation, and the sampled value can be used during the program operation to modify appropriate programming parameters.

Figure 4:
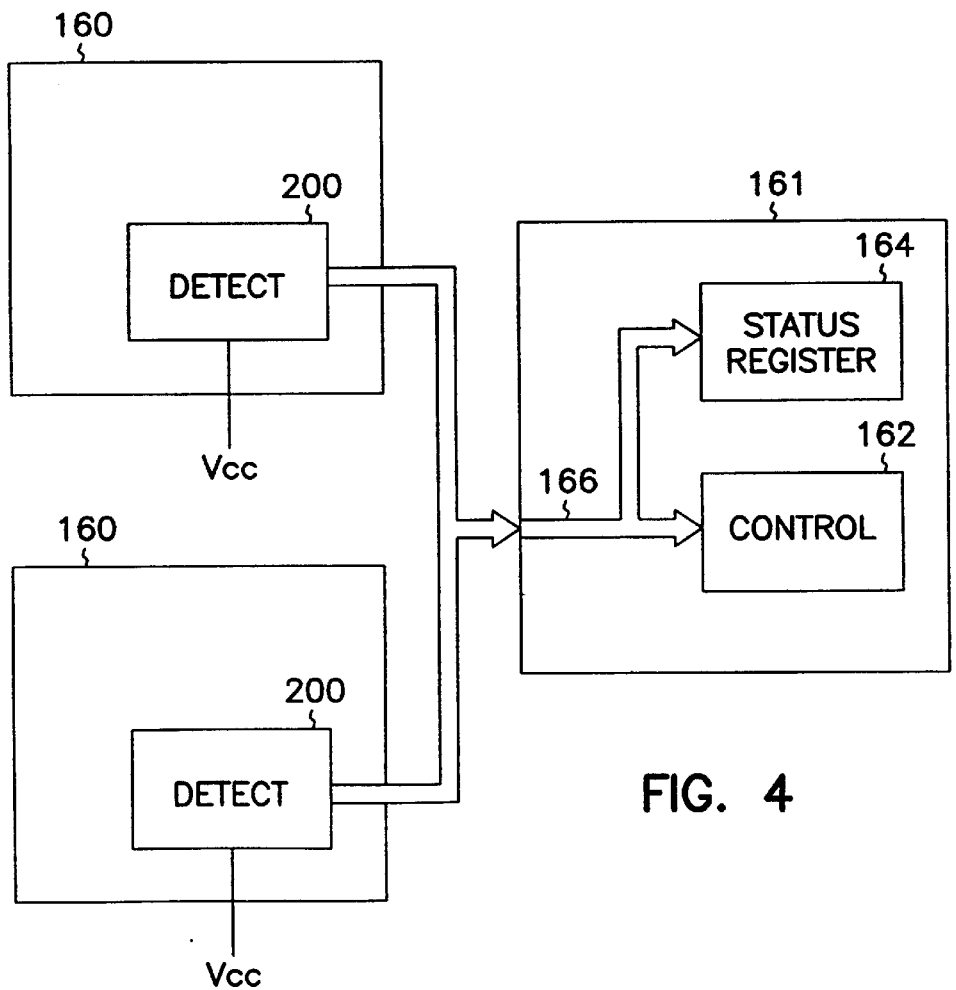
FIG. 4 is a block diagram of a system having a voltage detection circuit.

FIG. 4 is a block diagram of an alternate system having multiple integrated circuits 161. Each circuit includes a supply voltage detector 200 which provides output signals to an external processor 161. The processor includes control circuitry 162 to determine a present voltage level and an optional status register 164. This system allows one processor to monitor the supply voltage of several integrated circuits simultaneously. It will be understood that in another embodiment, the control circuit 162 can be included in each integrated circuit 160, and the status register located in an external device.

It may be desired to use a look-up table for comparing output from the supply voltage detection circuit with recorded data to determine an operating voltage. The look-up table can be located in the integrated circuit 160, such as a portion of non-volatile memory, or it can be located externally. To produce the data initially stored in the look-up table, testing of the circuit under known conditions is conducted. For example, during electrical testing of the integrated circuit the voltage sensing circuitry can be read with supply voltages of 2.7 volts and 3.0 volts. The voltage detector output for both readings is stored in the look-up table.

During operation, the voltage detector output can be compared to the data stored in the look-up table. The result of the comparison gives an indication of the voltage of the integrated circuit with the built-in sensing circuitry. For example, two different integrated circuits incorporating supply voltage sensing circuitry having a three-bit output can be tested at 2.7 volts and 3 volts to produce output as shown in Table 1.

TABLE 1

|  | Output at 2.7 volts | Output at 3 volts |
|---|---|---|
| Circuit 1 | 01 | 11 |
| Circuit 2 | 00 | 01 |

It will be appreciated that the difference between the outputs of Circuit 1 and Circuit 2 can be caused by variations in manufacturing processes. A controller can then compare output from the integrated circuits to data in the look-up table to determine an operating voltage. That is, if the controller reads 01 from Circuit 1, the operating voltage would be around 2.7 volts. If the controller reads 01 from Circuit 2, the operating voltage would be around 3 volts. This method allows for the calibration of the voltage sensor, even if the manufacturing process has great variations.

Figure 5:
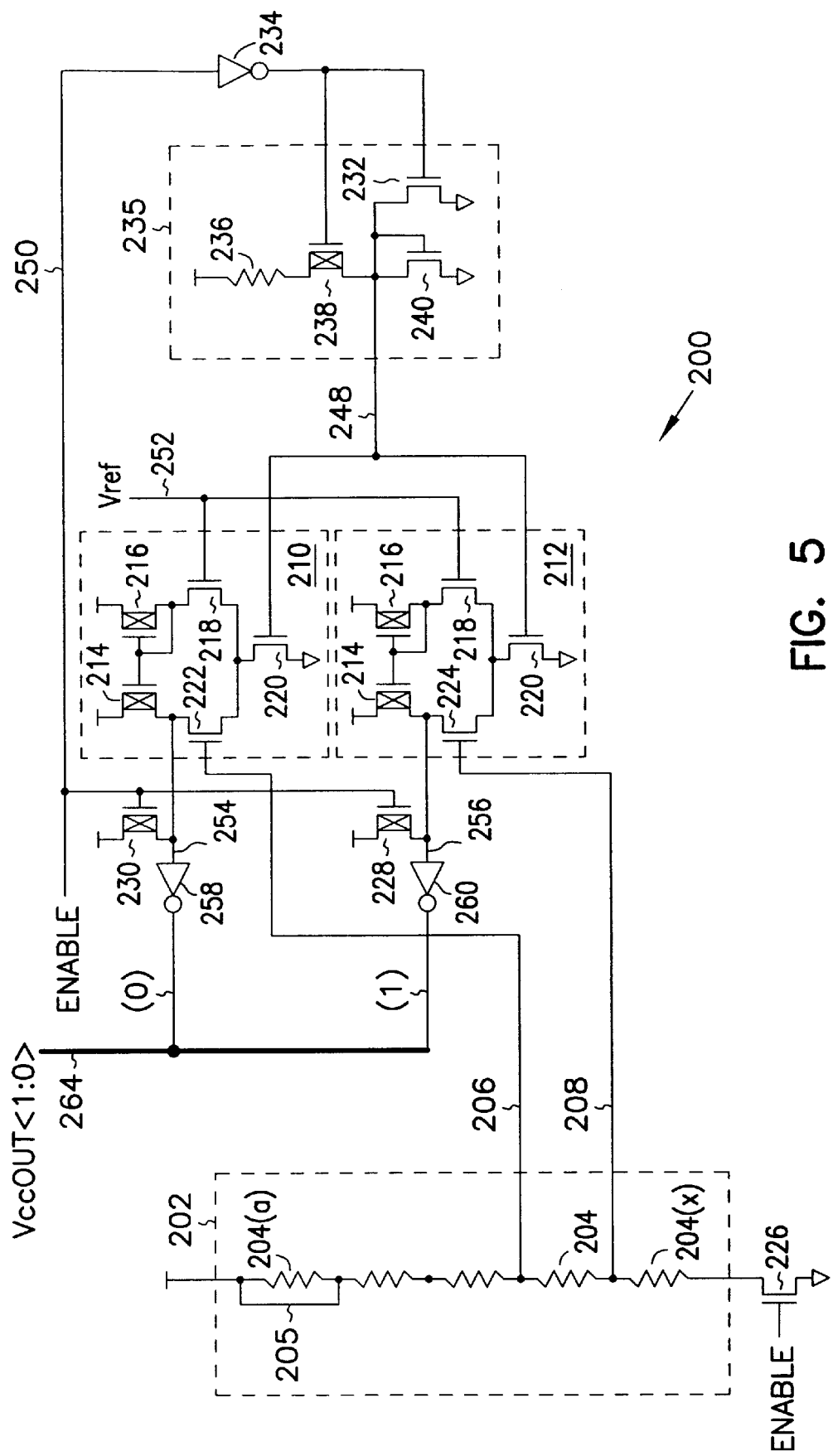
FIG. 5 is one embodiment of a voltage detection circuit.

FIG. 5 is a schematic diagram of one embodiment of a voltage detection circuit 200. The circuit includes a resistive ladder, or voltage divider circuit 202 having several resistors 204. Two sample nodes 206 and 208 are illustrated for coupling voltages from the voltage divider circuit to differential amplifier circuits 210 and 212, respectively. The resistors can be fabricated as n-well resistors, and the resistor ladder can have optional bypasses conductors 205 for adjusting the voltage divider. That is, the bypasses are conductive paths connected to each end of a resistor which can be opened using known techniques such as mask or fuse options. Each differential amplifier circuit includes two p-channel transistors 214 and 216. Each differential amplifier circuit also includes n-channel transistors 218 and 220. Differential amplifier circuit 210 has an n-channel transistor 222 coupled to node 206, and differential amplifier circuit 212 has an n-channel transistor 224 coupled to node 208. It will be recognized by those skilled in the art that different comparator circuits can be used, and that the present supply voltage detector should not be limited to the differential amplifier circuits illustrated.

Enable circuitry is included in the voltage detection circuit. The enable circuitry includes n-channel transistors 226 and 232, p-channel transistors 228 and 230, and inverter 234. An activation/disable circuit 235 is provided to control transistors 220 of the differential amplifier circuits 210 and 212. The activation/disable circuit includes resistor 236, p-channel transistor 238, and diode connected n-channel transistor 240.

In operation, the voltage detector is coupled to two input signals, Enable and Vref. The Enable signal is a normally high signal and resets the outputs of the voltage detector when it transitions to a low state. Vref is a reference voltage which is substantially insensitive to changes in the supply voltage, Vcc. Vref is preferably 2 volts and generated using internal circuitry. However, the reference voltage, Vref, can be externally provided on an input pin, and the exact potential value of Vref is not limited to 2 volts, but can be determined in conjunction with the values of the voltage divider and other circuits of the integrated circuit.

When the Enable signal is high, transistor 226 is turned on and a current path is formed through voltage divider 202. The voltages provided on nodes 206 and 208 will be dependant upon the level of Vcc and the values of resistors 204(a)–(x). Further, because Enable is high, the output of invertor 234 will be low. P-channel transistor 238 is coupled to the output of inverter 234 and will be turned on when the output is low. The output node 248 of the activation circuit 235 will be pulled high through resistor 236 and transistor 238. Transistors 220 of the differential amplifier circuits will be activated in response to output node 248.

When active, differential amplifier circuits 210 and 212 compare the voltage on nodes 206 and 208, respectively, with the Vref voltage. With reference to differential amplifier 210, if node 206 is higher than node 252 the output node 254 is pulled low. If a voltage on node 206 is lower than the Vref voltage, output node 254 is pulled high. Inverter 258 is provided to convert a voltage on node 254 into a digital signal. Differential amplifier 212 works in the same manner to provide an output signal on node 256.

A two-bit output signal is therefore provided to indicate the current value of the supply voltage. It will be appreciated that a two-bit output cannot represent all possible values of Vcc at a high resolution, and that the output is preferably used to provide a voltage range of Vcc. Assuming a Vref voltage of 2 volts, the following table illustrates a three range detector using Output (0) of inverter 258, and Output (1) of inverter 260.

TABLE 2

| Vcc | Output (1) | Output (0) |
|---|---|---|
| <2.6 | 0 | 0 |
| 2.6 < Vcc < 3.1 | 0 | 1 |
| >3.1 | 1 | 1 |

It will be understood that a two bit output can provide four possible voltage ranges. Table 2, however, illustrates a three voltage range scheme which does not need to be decoded. A four voltage range scheme can be provided with an additional step in the resistor ladder and differential amplifier, and simple logic to encode a two bit output.

During operation, the outputs of the supply voltage detector circuit can be sampled and used directly, or through a latch, by control circuit 162. Alternately, the output of the supply voltage detector circuit can be compared with data in a look-up table by the control circuit 162 to determine the operating range of the supply voltage. If the integrated circuit is a memory device such as a flash memory, the look-up table can be stored in the integrated circuit. The status register can be implemented as a volatile or non-volatile table, and the control circuit 162 can adjust the operation of the integrated circuit in response to the detected supply voltage range. For example, the timing of a programming pulse of a flash memory can be adjusted based upon the measured supply voltage. Thus the operation of the circuit can be adjusted as the supply voltage changes.

To disable the voltage detector circuit 200 prior to sampling the output of the voltage detector, the Enable signal transitions to a low logic state to turn off transistor 226. Transistors 220 are also turned off in response to the activation of transistor 232. Transistors 228 and 230 are activated to force nodes 254 and 256, respectively, to a high logic state. The two-bit output signal, therefore, of the voltage detector is a logic 00.

It will be understood that additional differential amplifier circuits can be added to increase the resolution of the voltage ranges. In this embodiment, additional resistors and sample nodes will have to be added to the voltage divider circuit 202.

Conclusion

An integrated circuit has been described which includes a supply voltage detection circuit. The detection circuit produces an output which indicates a voltage range of the supply voltage. The output of the detection circuit is used to adjust the operation of the integrated circuit. One embodiment of the integrated circuit has been described as a flash memory device which can include a controller to monitor the output of the detection circuit, or provide the output to a controller. The controller uses the detection circuit output to adjust memory operation, such as operating frequency. The output can be stored in a latch or used directly from the sensor. The output of the detection circuit preferably produces a multiple bit output which can be compared to a data in a look-up table located within the integrated circuit. The table can also be located outside the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated memory device comprising:
    a voltage detection circuit for tracking a voltage of the integrated memory device and producing an output signal indicating a voltage range;
    status register for storing the output signal of voltage detection circuit; and
    a control circuit coupled to the voltage detection circuit for receiving the output signal on an output node and adjusting an operation parameter of the integrated circuit memory device in response to the output signal.

2. The integrated memory device of claim 1 wherein the integrated memory device is a flash memory.

3. The integrated memory device of claim 1 wherein the status register is a volatile latch circuit.

4. A flash memory device comprising:
    an array of non-volatile memory cells;
    an input node for receiving a supply voltage;

a voltage detection circuit connected to the input node for tracking the supply voltage and producing a multiple bit output signal;

control circuitry for controlling operation of the flash memory, the control circuit is connected to the voltage detection circuitry for receiving the output signal on an output node and adjusting the operation of the flash memory in response thereto; and a data look-up table stored in the array of non-volatile memory cells, the data table comprising voltage range data corresponding to voltage detection circuitry output signals under known voltage conditions.

5. An integrated memory device comprising:

a voltage detection circuit for tracking a voltage of the integrated memory device and producing an output signal indicating a voltage range;

a control circuit coupled to the voltage detection circuit for receiving the output signal on an output node and adjusting an operation parameter of the integrated circuit memory device in response to the output signal, and wherein the voltage detection circuit comprises:
  a voltage divider circuit coupled between the first voltage and a lower voltage; and
  a plurality of comparator circuits coupled to the voltage divider circuit and a reference voltage, each of the comparator circuits comparing a voltage sampled from the voltage divider circuit with the reference voltage for providing the multiple bit digital output signal on a plurality of output nodes.

6. The integrated memory device of claim 5 wherein the voltage divider circuit comprises a plurality of series connected resistors.

7. The integrated memory device of claim 5 wherein the plurality of series connected resistors are n-well resistors.

8. The integrated memory device of claim 5 wherein the plurality of comparator circuits are differential circuits.

9. The integrated memory device of claim 5 wherein the voltage detection circuit further comprises:

enable circuitry for resetting the multiple bit output signal to a predetermined level, and disabling the comparator circuits.

10. The integrated memory device of claim 9 wherein the enable circuitry further comprises:

multiple pull-up transistors connected to multiple output nodes, the pull-up transistors being activated by an enable signal; and disable circuitry connected to the plurality of comparator circuits for disabling the plurality of comparator circuits in response to the enable signal.

11. A flash memory device comprising:

an array of non-volatile memory cells;

an input node for receiving a supply voltage;

a voltage detection circuit connected to the input node for tracking the supply voltage and producing a multiple bit output signal;

control circuitry for controlling operation of the flash memory, the control circuit is connected to the voltage detection circuitry for receiving the output signal on an output node and adjusting the operation of the flash memory in response thereto; and a data latch circuit for storing the output of the voltage detection circuitry.

12. An integrated memory device comprising:

a voltage detection circuit for tracking a voltage of the integrated memory device and producing an output signal indicating a voltage range;

a control circuit coupled to the voltage detection circuit for receiving the output signal on an output node and adjusting an operation parameter of the integrated circuit memory device in response to the output signal; and a non-volatile look-up table for storing data corresponding to output from the voltage detection circuit under known voltage conditions.

13. An integrated memory device comprising:

a voltage detection circuit for tracking a voltage of the integrated memory device and producing a multiple-bit digital output signal indicating a voltage range;

a status register latch circuit for storing the multiple-bit output signal; and a control circuit coupled to the voltage detection circuit and the status register latch circuit, the control circuit adapted to activate the voltage detection circuit and receive the multiple-bit output signal, and adapted to retrieve the multiple-bit output signal from the status register latch circuit.

14. The integrated memory device of claim 13 further comprising a non-volatile look-up table for storing data corresponding to output from the voltage detection circuit under known voltage conditions.

15. A method of operating an integrated circuit the method comprising:

receiving a supply voltage;

detecting a voltage range of the supply voltage using an internal voltage detector;

generating a multiple bit signal representing the detected voltage range;

adjusting the operation of the integrated circuit in response to the detected voltage range; and comparing the generated signal with data stored in a look-up table prior to adjusting the operation of the integrated circuit.

16. The method of claim 15 further comprising the steps of:

testing the integrated circuit under known voltage conditions; and storing data in the look-up table based upon signals generated from the internal voltage detector.

17. A method of operating an integrated circuit, the method comprising:

receiving a supply voltage;

detecting a voltage range of the supply voltage using an internal voltage detector:

generating a multiple bit signal representing the detected voltage range;

adjusting the operation of the integrated circuit in response to the detected voltage range; and wherein detecting the voltage range comprises:
  tapping a voltage divider circuit to obtain multiple samples of the supply voltage; and
  comparing the multiple samples to a reference voltage.

18. A flash memory device comprising:

an array of non-volatile memory cells;

an input node for receiving a supply voltage;

a voltage detection circuit connected to the input node for tracking the supply voltage and producing a multiple bit digital output signal;

control circuitry for controlling operation of the flash memory, the control circuit is connected to the voltage detection circuitry for receiving the output signal on an output node and adjusting the operation of the flash memory in response thereto; and the voltage detection circuit comprises:
a voltage divider circuit coupled between the input node and a ground potential; and
a plurality of comparator circuits coupled to the voltage divider circuit and adapted to receive a reference voltage, each of the comparator circuits comparing a voltage sampled from the voltage divider circuit with the reference voltage for providing an output on multiple output lines.

19. The flash memory device of claim 18 wherein the voltage divider circuit comprises a resistor ladder.

20. The flash memory device of claim 18 wherein the voltage detection circuit further comprises:
enable circuitry for resetting the output of the voltage detection circuit to a predetermined level, and disabling the comparator circuits.

21. A method of operating an integrated circuit, the method comprising:
receiving a supply voltage;
detecting a voltage range of the supply voltage using an internal voltage detector;
generating a multiple bit signal representing the detected voltage range;
adjusting the operation of the integrated circuit in response to the detected voltage range; and
wherein the generated signal is latched in a latch circuit.

22. The method of claim 21 wherein the step of detecting is performed in response to a command from a control circuit.

23. The method of claim 21 further comprising the step of:
providing the generated signal on at least one external output line.

24. The method of claim 21 wherein the integrated circuit is a memory device.

25. A method of operating an integrated circuit, the method comprising:
receiving a supply voltage;
detecting a voltage range of the supply voltage using an internal voltage detector;
generating a multiple bit signal representing the detected voltage range;
adjusting the operation of the integrated circuit in response to the detected voltage range; and
wherein generating a multiple bit signal comprises:
comparing samples of the supply voltage to a reference voltage using multiple differential amplifier circuits; and
providing an output signal from each of the multiple differential amplifier circuits based upon the step of comparing.

26. The method of claim 25 further comprising the step of:
resetting the generated signal to a predetermined level prior to the step of comparing samples of the supply voltage to a reference voltage.

27. A method of operating an integrated circuit, the method comprising:
receiving a supply voltage;
detecting a voltage range of the supply voltage using an internal voltage detector;
generating a multiple bit signal representing the detected voltage range;
adjusting the operation of the integrated circuit in response to the detected voltage range; and
wherein adjusting the operation of the integrated circuit comprises:
receiving the generated signal on the at least one external output line with an external processor;
evaluating the generated signal with the processor; and
providing operating control signals to the integrated circuit from the processor.

28. A processing system comprising:
a controller;
a memory device coupled to the controller comprising a voltage detection circuit for tracking a voltage of the integrated memory device and producing an output signal indicating a voltage range; and
a status register for storing the output signal of voltage detection circuit; and
a control circuit coupled to the voltage detection circuit for receiving the output signal and adjusting an operation parameter of the integrated circuit memory device in response to the output signal.

29. The system of claim 28 wherein the control circuit is located in the controller, and the output signal is provided on a memory device output connection.

30. The system of claim 28 wherein the control circuit is located in the memory device.

31. The system of claim 28 wherein the voltage detection circuit comprises:
a voltage divider circuit coupled between the first voltage and a lower voltage; and
a plurality of comparator circuits coupled to the voltage divider circuit and a reference voltage, each of the comparator circuits comparing a voltage sampled from the voltage divider circuit with the reference voltage for providing the multiple bit digital output signal on a plurality of output nodes.

32. A method of operating a processing system comprising a memory device and a processor, the method comprising:
coupling the memory device to a supply voltage;
detecting a voltage range of the supply voltage using a voltage detector located in the memory device;
generating a multiple bit output signal from the voltage detector representing the detected voltage range;
adjusting the operation of the integrated circuit in response to the detected voltage range; and
wherein adjusting the operation of the integrated circuit comprises:
communicating the generated output signal on at least one external memory device output connection to the processor;
evaluating the generated signal with the processor; and
providing operating control signals to the memory device from the processor.

33. The method of claim 32 further including the step of latching the multiple bit output signal in the memory device.

34. The method of claim 32 further including the step of latching the multiple bit output signal in the processor.

* * * * *